(12) United States Patent
Okaguchi

(10) Patent No.: US 6,380,816 B1
(45) Date of Patent: Apr. 30, 2002

(54) OSCILLATOR AND VOLTAGE CONTROLLED OSCILLATOR

(75) Inventor: Kenjiro Okaguchi, Otokuni-gun (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/505,174

(22) Filed: Feb. 16, 2000

(30) Foreign Application Priority Data

Feb. 17, 1999 (JP) .......................................... 11-038564

(51) Int. Cl.[7] ................................................ H03B 5/32
(52) U.S. Cl. ............... 331/107 A; 331/167; 331/117 R; 331/116 M; 331/158
(58) Field of Search ........................ 331/116 M, 107 A, 331/158, 135, 117 R, 117 FE, 167

(56) References Cited

U.S. PATENT DOCUMENTS

| | | | |
|---|---|---|---|
| 4,581,593 A | 4/1986 | Okanobu | 331/116 R |
| 5,646,580 A | 7/1997 | Perkins | 331/116 R |
| 5,764,112 A | 6/1998 | Bal et al. | 331/116 FE |

FOREIGN PATENT DOCUMENTS

| | | |
|---|---|---|
| EP | 0 767 532 A1 | 4/1997 |
| JP | 9-102712 | 4/1977 |
| JP | 3-238905 | 10/1991 |

OTHER PUBLICATIONS

Shimuzu et al., "Love–Type–Saw Resonator of Small Size with Very Low Capacitance Ratio and its Application to VCO", Ultrasonics Symposium, pp. 103–108 (1990).

Sehmisch et al., "Fequenzeinstellung und Modulation von Verzögerungsleitungs–Oszillatoren . . . ", Nachrichtentechnik Elektronik, De, Veb Verlag Technik, Berlin, 39:1, p. 31 (1989).

Primary Examiner—Arnold Kinkead
(74) Attorney, Agent, or Firm—Burns, Doane, Swecker & Mathis, LLP

(57) ABSTRACT

An oscillator which oscillates at a predetermined frequency includes a first inverting amplifier and a second inverting amplifier connected in antiparallel with each other, a surface acoustic wave resonator connected in parallel with one of the first inverting amplifier and the second inverting amplifier, and a filter connected between the first inverting amplifier and the second inverting amplifier for blocking a direct-current signal while allowing a signal of the predetermined frequency to pass.

12 Claims, 9 Drawing Sheets

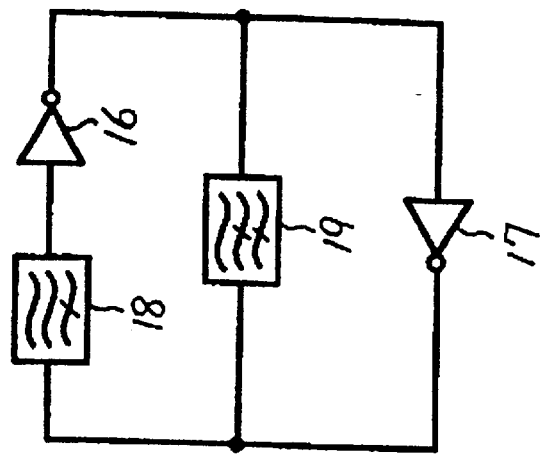
Fig. 2C  DIFFERENTIAL-RESONATOR TYPE VCO
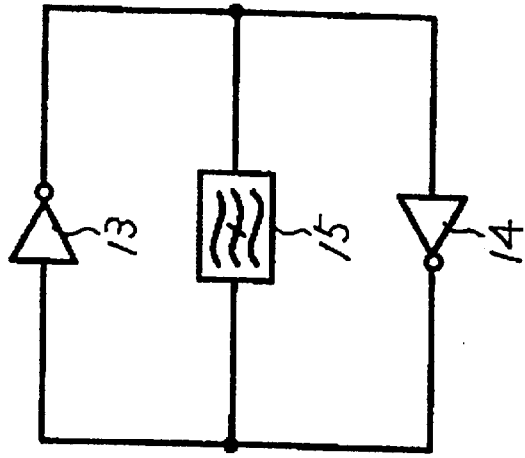
Fig. 2B  DIFFERENTIAL-LC TYPE VCO
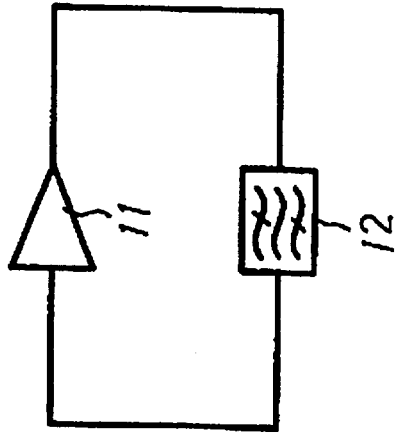
Fig. 2A  COLPITTS TYPE VCO

OSCILLATOR AND VOLTAGE CONTROLLED OSCILLATOR

BACKGROUND OF INVENTION

1. Field of the Invention

The present invention relates to oscillators and voltage controlled oscillators, and, more particularly, relates to an oscillator and a voltage controlled oscillator which have a surface acoustic wave resonator.

2. Description of the Related Art

FIG. 12 schematically illustrates a circuit diagram showing the configuration of a conventional Colpitts voltage controlled oscillator (VCO).

In FIG. 12, the Colpitts VCO includes an oscillation circuit 60, a buffer circuit 66, and a coupling capacitor 67 for coupling the oscillation circuit 60 and the buffer circuit 66. The oscillation circuit 60 includes a surface acoustic wave (SAW) resonator 51, an NPN transistor 52, capacitors 53 to 56, a varicap 57, and resistance elements 58 and 59. The buffer circuit 66 includes an NPN transistor 61 and resistance elements 62 to 65.

The oscillating frequency of the oscillation circuit 60 is determined by the resonance frequency of the SAW resonator 51 and the capacitance of the oscillation circuit 60. The oscillating frequency of the oscillation circuit 60 varies because the capacitance of the varicap 57 changes in accordance with change of the input voltage VI to the oscillation circuit 60. Therefore, an output signal VO having a desired frequency can be obtained by adjusting the input voltage VI. This oscillation circuit is widely used as a reference-signal generator for a television tuner, a portable communication device, and the like.

FIG. 13 schematically illustrates a circuit diagram of a conventional differential-LC VCO. In FIG. 13, the differential-LC VCO includes a parallel LC circuit 71, resistance elements 74 and 75, NPN transistors 76 and 77, and a voltage controlled current source 78. The parallel LC circuit 71, having an inductor 72 and a capacitor 73 connected in parallel, is connected between the collectors (nodes N71 and N72, respectively) of the NPN transistors 76 and 77. The collectors of the NPN transistors 76 and 77 are connected to a power line of a source electrical potential Vcc via resistance elements 74 and 75, respectively. The bases of the NPN transistors 76 and 77 are connected to the collectors of the NPN transistors 77 and 76, respectively. The emitters of the NPN transistors 76 and 77 are each grounded, via the voltage controlled current source 78, to a ground line of a ground potential GND.

The oscillating frequency of this differential-LC VCO is determined by the parallel resonant frequency of the parallel LC circuit 71 and the internal capacitance of each of the NPN transistors 76 and 77 which are connected in parallel with the parallel LC circuit 71. Because the capacitance of each of the NPN transistors 76 and 77 is varied by the values of the currents passing through the NPN transistors 76 and 77, the oscillating frequency of the VCO can be adjusted by causing an external control voltage to control the current of the voltage controlled current source 78. This circuit is utilized by an integrated circuit for television, and the like.

However, the Colpitts VCO shown in FIG. 12 has the following problems: because of the single ended configuration thereof, noise generated by the oscillation may produce adverse effects on other circuits via the power source; and conversely, a signal of the VCO may be modulated by high frequency noise coming through the power source. Furthermore, although it is intended to miniaturize the circuit by integrating the components of the circuit other than the SAW resonator 51, because there are many capacitance elements 53 to 56 and 67 which occupy more space than the resistance elements or the transistors, the integration of those elements is difficult. Also, when each element is constructed as a discrete component, since many elements are required for the circuit, miniaturization of the circuit is difficult.

In the differential-LC VCO in FIG. 13, although a wire wound variable inductor having a high quality-factor (Q-factor) must be employed as the inductor 72 to obtain an accurate and stable oscillation, miniaturization of the VCO is difficult due to the large size thereof. Moreover, in order to obtain a desired frequency, the inductance of the variable inductor must be adjusted. Additionally, because the VCO requires a variable inductor, the inductance of which must be adjusted by a mechanical operation as a variable component, the reliability is low.

SUMMARY OF THE INVENTION

Accordingly, it is an object of the present invention to provide an oscillator and a voltage controlled oscillator which are highly resistant to noise, have accurate oscillation without adjustment, have high reliability, require less components, and are inexpensive and compact.

To this end, according to a first aspect of the present invention, there is provided an oscillator oscillating at a predetermined frequency. The oscillator includes a first inverting amplifier and a second inverting amplifier connected in antiparallel with each other, a surface acoustic wave resonator connected in parallel with one of said first inverting amplifier and said second inverting amplifier and a filter connected between said first inverting amplifier and said second inverting amplifier for blocking a direct-current signal while allowing a signal of said predetermined frequency to pass.

Since the direct current signal is blocked by the filter, the oscillating frequency of this oscillator is determined primarily by the parallel resonant frequency of the surface acoustic wave resonator.

This oscillator is not susceptible to the influence of external noise flowing via the power source and, conversely, is unlikely to convey noise to other circuits, compared to the Colpitts, due to a differential circuit employed therein. Also, the number of components of the oscillator is small, which makes miniaturization easy and is effective for reducing costs. Furthermore, because a capacitor having large capacitance is not used, it is possible to integrate a circuit. By integrating the entire circuit including the resonator, or the circuit other than the resonator, further miniaturization as well as further reduction in costs is possible. Effects of reduction in the number of components includes improving reliability of the oscillator.

Since, in the differential LC oscillator, when the Q-factor of the inductor is low, the Q-factor of the oscillator inevitably becomes low, which makes the stability of the oscillating frequency worse. On the other hand, since this oscillator uses a SAW resonator, accurate and highly stable oscillation can be obtained without adjustment. Moreover, since a variable component which needs mechanical adjustment is not used, reliability becomes high and deterioration with age becomes less.

According to a second aspect of the present invention, there is provided a voltage controlled oscillator which oscillates at a frequency in accordance with a control voltage. The voltage controlled oscillator includes a pair of differential transistors, in which a first electrode of one transistor is connected to a first electrode of the other transistor and an input electrode of one transistor is connected to a second electrode of the other transistor with regard to each of the transistors, a surface acoustic wave resonator connected between the second electrodes of the pair of differential transistors, a first capacitor coupled between the input electrode of at least one transistor of the pair of differential transistors and the second electrode of the other transistor, and a voltage controlled current source connected to the first electrodes of the pair of differential transistors for flowing currents having a value in accordance with the control voltage.

Because the first capacitor blocks the direct current, the oscillating frequency of this voltage controlled oscillator is determined primarily by the parallel resonant frequency of the surface acoustic wave resonator and the value of current flowing via the pair of differential transistors. This voltage controlled oscillator also enables the same effect as obtained by the invention according to a first aspect of the invention to be obtained.

The voltage controlled oscillator may further have a resistance element connected in parallel to the surface acoustic wave resonator. In this case, the variable frequency range is expanded.

The voltage controlled oscillator may further have an inductor connected in series to the surface acoustic wave resonator between the second electrodes of the pair of differential transistors. In this case, the variable frequency range is expanded.

The voltage controlled oscillator may further have an inductor connected in parallel to the surface acoustic wave resonator. In this case, the variable frequency range is expanded.

The voltage controlled oscillator may further have a second capacitor connected in series to the surface acoustic wave resonator between the second electrodes of the pair of differential transistors. In this case, the variable frequency range becomes narrowed, whereby oscillation becomes more stable.

The voltage controlled oscillator may further have a second capacitor connected in parallel to the surface acoustic wave resonator. In this case, the variable frequency range becomes narrowed, whereby oscillation becomes more stable.

BRIEF DESCRIPTION OF THE DRAWINGS

FIGS. 2A, 2B, and 2C are diagrams illustrating theories of operation of VCOs;

DESCRIPTION OF THE PREFERRED EMBODIMENT

Figure 1:
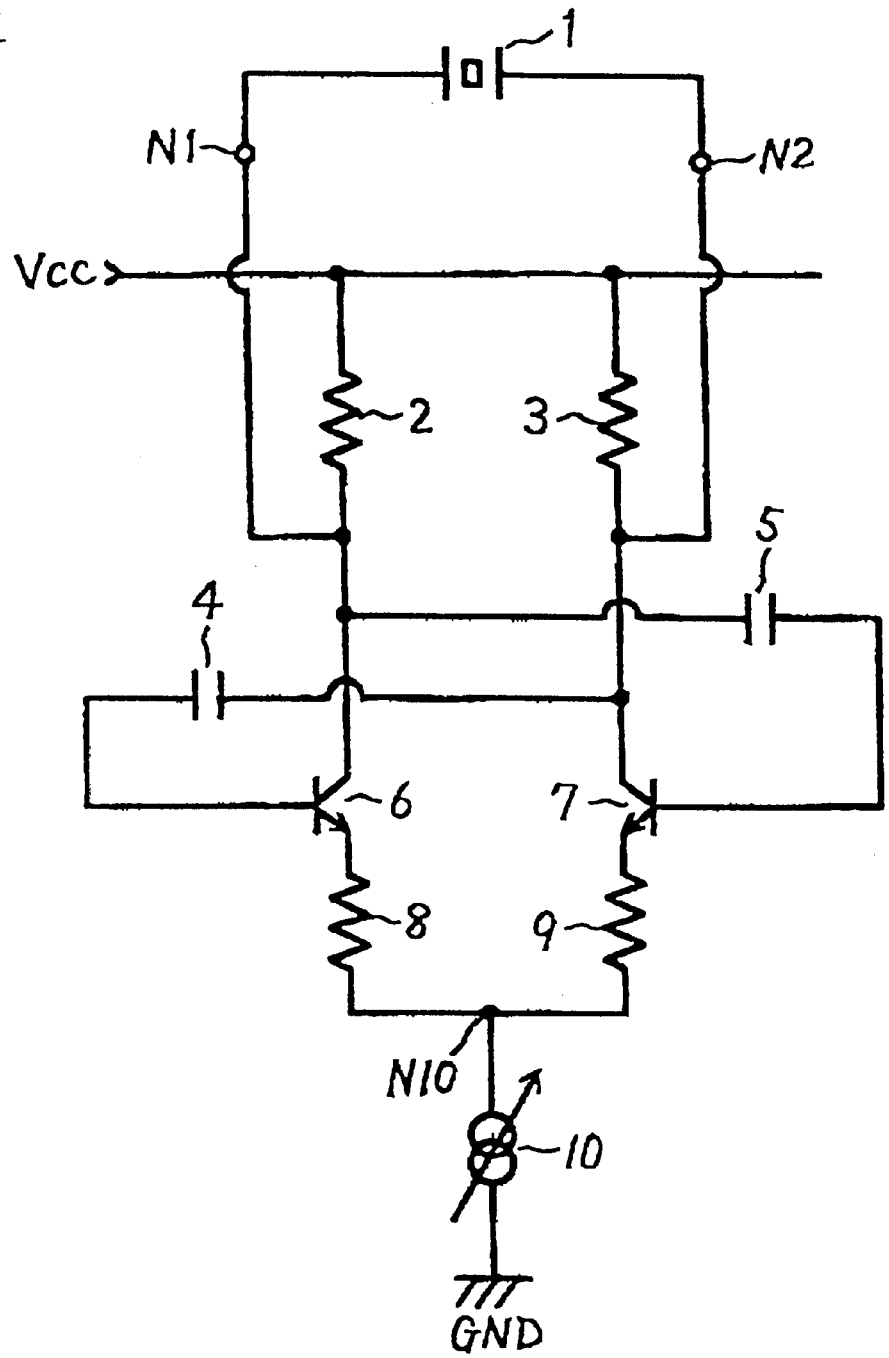
FIG. 1 is a circuit diagram showing the configuration of a differential-resonator VCO according to one embodiment of the present invention.

FIG. 1 shows a circuit diagram showing the configuration of a differential-resonator VCO according to an embodiment of the present invention. In FIG. 1, the differential-resonator VCO includes an SAW resonator 1, resistance elements 2, 3, 8, and 9, capacitors 4 and 5, NPN transistors 6 and 7, and a voltage controlled current source 10.

The SAW resonator 1 is connected between the collector (a node N1) of the NPN transistor 6 and the collector (a node N2) of the NPN transistor 7. The collectors of the NPN transistors 6 and 7 are connected via the resistance elements 2 and 3, respectively, to a power line of a source potential Vcc. The bases of the NPN transistors 6 and 7 are connected via the capacitors 4 and 5 to the collectors of the NPN transistors 7 and 6, respectively. The emitters of the NPN transistors 6 and 7 are connected via the resistance elements 8 and 9, respectively, to a node N10. The NPN transistors 6 and 7 constitute a pair of differential transistors. The voltage controlled current source 10 is connected between the node N10 and a ground line of a ground potential GND, and provides current in accordance with an external control voltage. A voltage between the nodes N1 and N2 corresponds to an output signal.

The operation of the differential-resonator VCO will now be described with comparison to that of conventional VCOs. The Colpitts type VCO is basically constructed by looping an amplifier 11 and a resonator 12, as shown in FIG. 2A. When the resonator 12 oscillates at the resonant frequency, the impedance of the resonator 12 has a minimum value and the loop gain of the circuit has a maximum value. Therefore, the Colpitts type VCO oscillates at the resonant frequency of the resonator 12.

The differential-LC type VCO is basically constructed by, as shown in FIG. 2B, connecting a parallel LC circuit 15 in parallel with loop-connected inverting amplifiers 13 and 14. The impedance of the parallel LC circuit 15 has a maximum at the parallel resonant frequency thereof. When the loop gain thereof is 1 or more, the phase of the loop is 2 np (n is an integer). Therefore, the differential-LC type VCO oscillates at the parallel resonant frequency of the parallel LC circuit 15.

Figure 3:
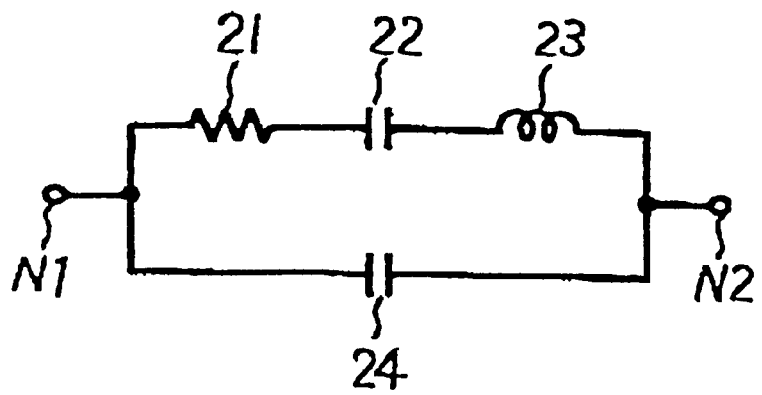
FIG. 3 is a circuit diagram showing an equivalent circuit of an SAW resonator shown in FIG. 1.
Figure 4:
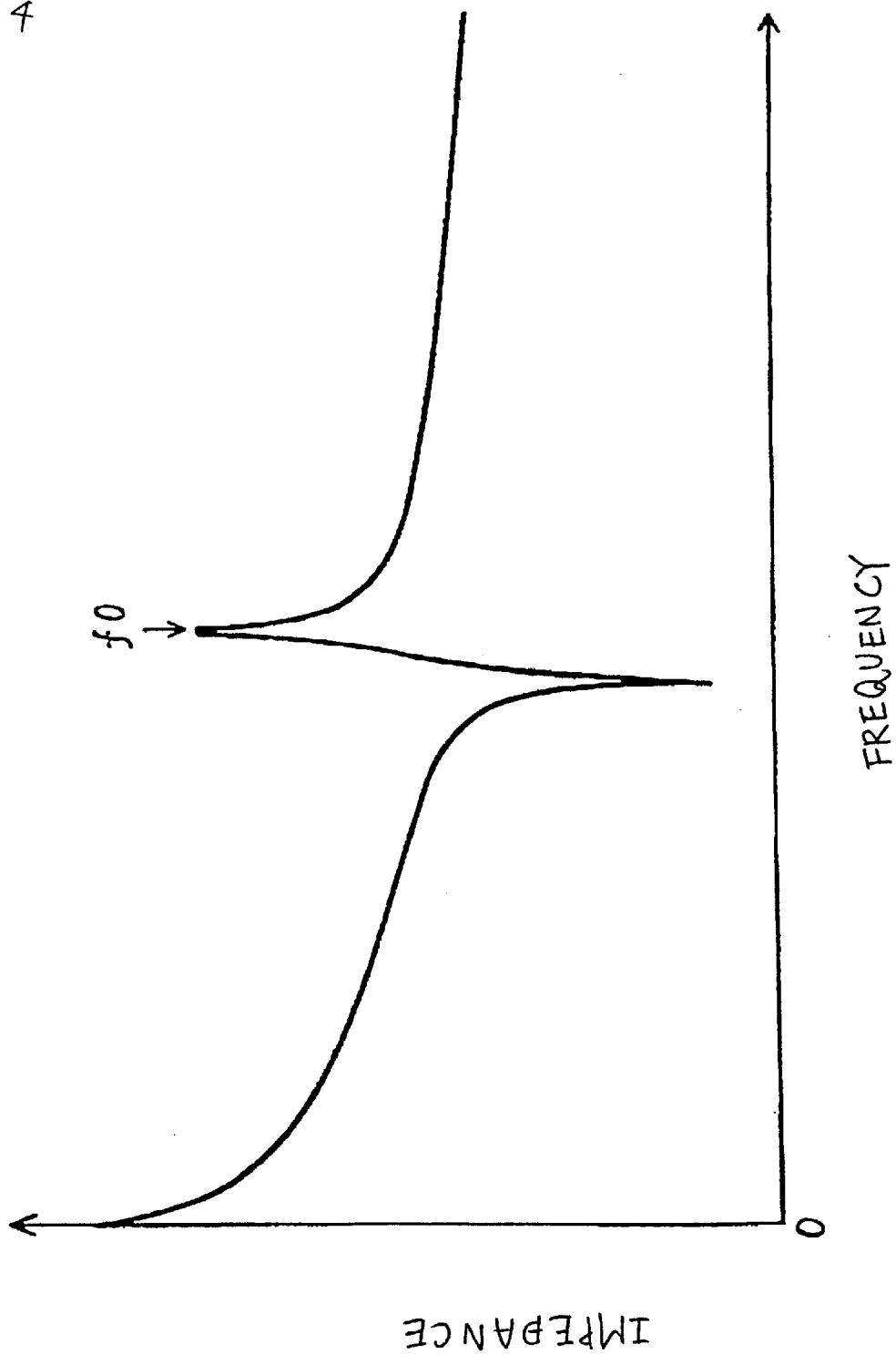
FIG. 4 is a graph showing frequency characteristics of the SAW resonator shown in FIG. 1.

The impedance of the parallel LC circuit 15 has a maximum at the parallel resonant frequency. The more the frequency of the parallel LC circuit 15 deviates from the parallel resonant frequency, the more the impedance thereof monotonically decreases. However, a model circuit of the SAW resonator 1 includes, as shown in FIG. 3, a resistance element 21, a capacitor 22, and a inductor 23, which are connected in series between the nodes N1 and N2, and a capacitor 24, which is connected in parallel with the above components. As shown in FIG. 4, the impedance of the resonator has a peak value at a parallel resonant frequency f0, and further goes to infinity at a frequency of 0 Hz, i.e., that of a direct current. In the oscillation circuit, the loop gain of the circuit obtained at direct current exceeds the loop gain obtained at the current of the parallel resonant frequency f0. Accordingly, the VCO in FIG. 2B cannot be oscillated at the parallel resonant frequency f0 only by replacing the parallel LC circuit 15 with the SAW resonator 1.

A differential-resonator type VCO, as shown in FIG. 2C, includes inverting amplifiers 16 and 17 connected in series, a filter 18 connected between the output node of the inverting amplifier 17 and the input node of the inverting amplifier 16 for blocking the direct-current signal while allowing the signal having the parallel resonant frequency f0 to pass, and a SAW resonator 19 connected in parallel with the inverting amplifier 17. Because the filter 18 prevents the direct current from being input to the inverting amplifiers 16 and 17, the loop gain of the oscillation circuit decreases at direct current, and has a maximum value at the current of the parallel resonant frequency f0 of the SAW resonator 19. Therefore the differential-resonator type VCO oscillates at the parallel resonant frequency f0 of the SAW resonator 19.

The circuit diagram in FIG. 1 is an embodiment of the circuit block diagram in FIG. 2C. The capacitors 4 and 5 constitute a direct-current blocking filter. The resistance elements 2 and 3 are provided for bias of the NPN transistors 6 and 7, and the resistance elements 8 and 9 are provided for limiting currents.

The oscillating frequency of this differential-resonator VCO is determined by the resonant frequency f0 of the SAW resonator 1 and the internal capacitance of each of the NPN transistors 6 and 7 in parallel with the SAW resonator 1. Because the capacitance of each of the NPN transistors 6 and 7 is varied by the values of currents passing through the NPN transistors 6 and 7, the oscillating frequency of the VCO can be controlled by causing the external control voltage to control the current value of the current source 10. The oscillating frequency signal is output from across the nodes N1 and N2.

Figure 5:
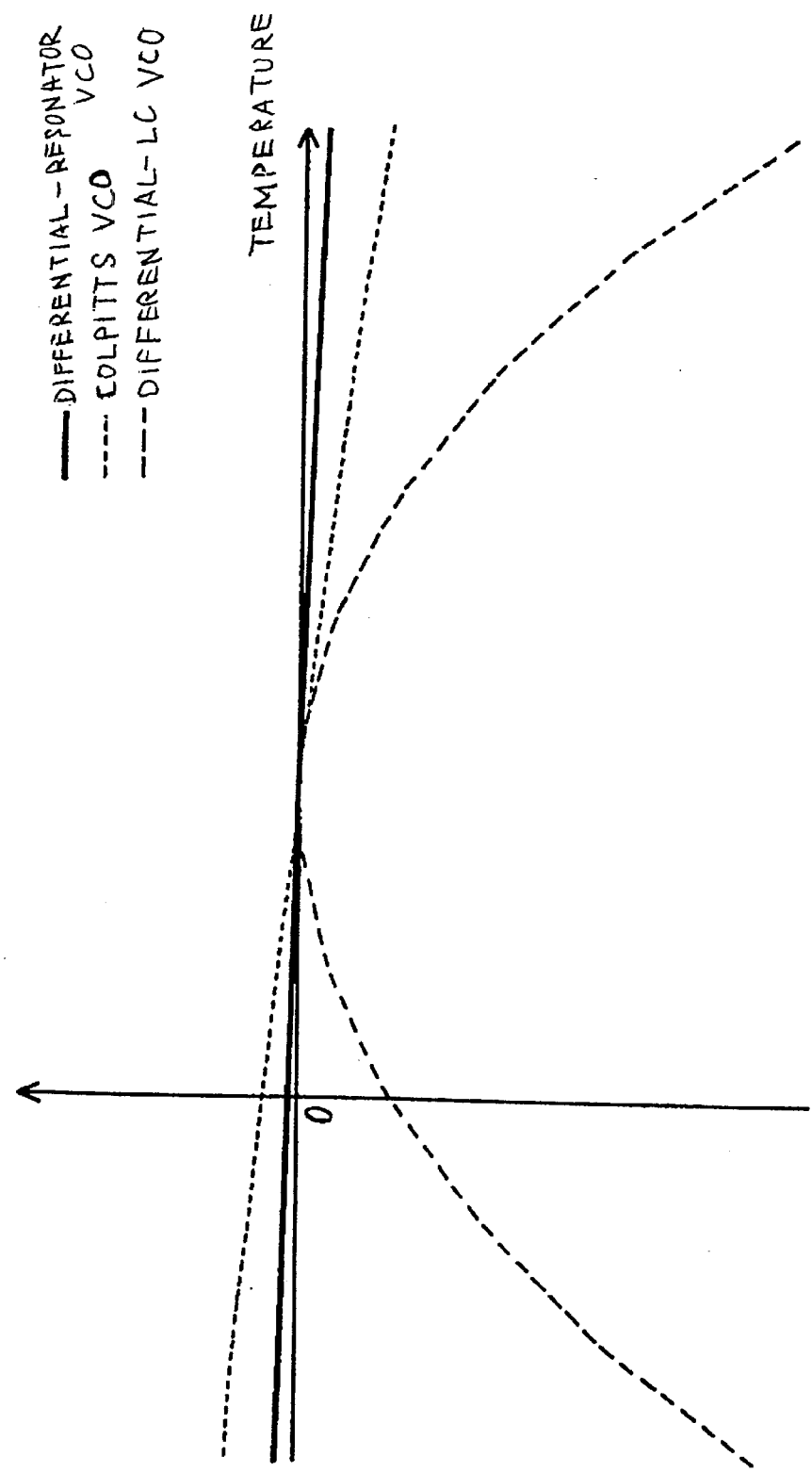
FIG. 5 is a graph illustrating effects of the differential-resonator VCO shown in FIG. 1.
Figure 6:
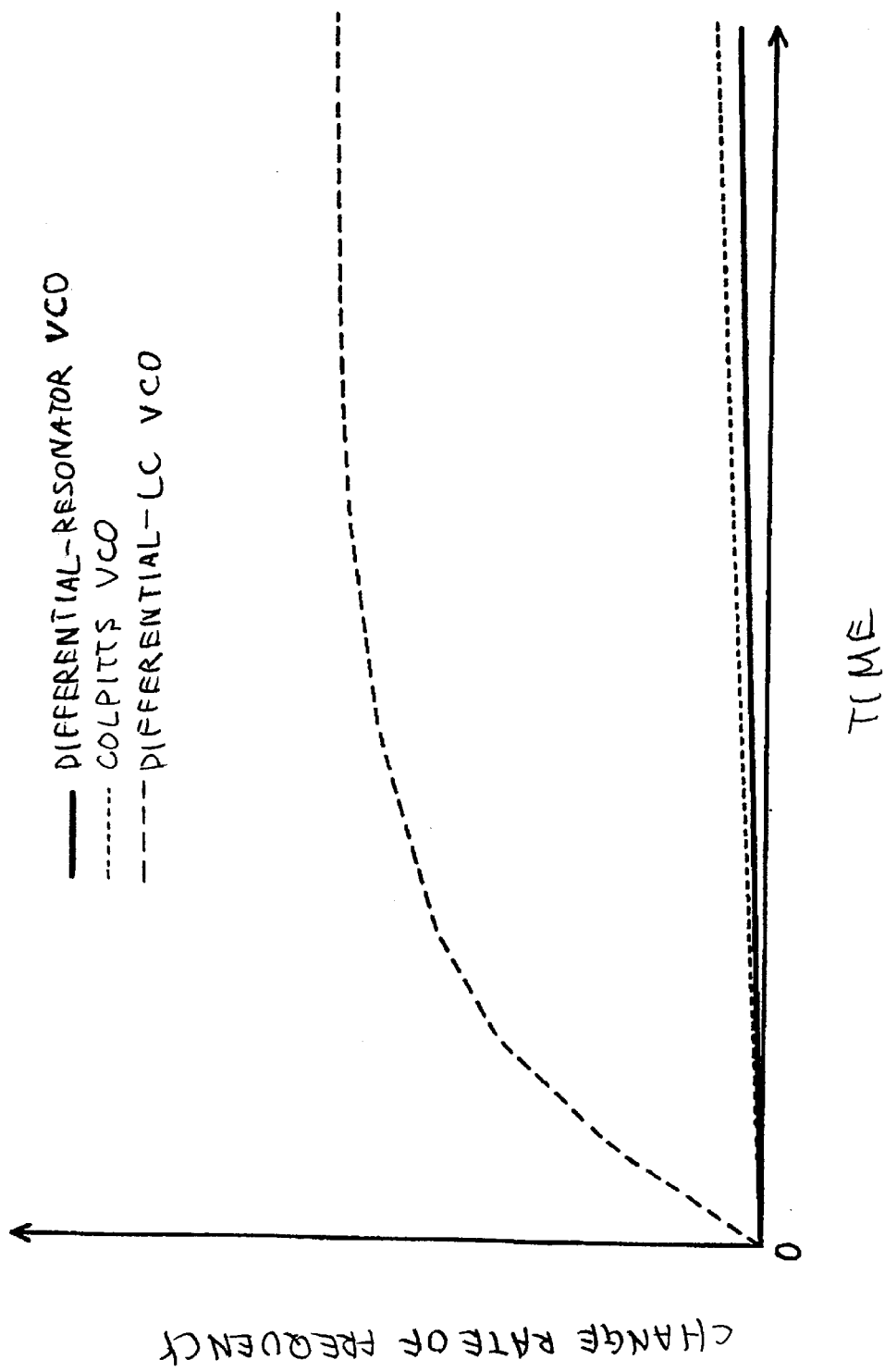
FIG. 6 is another graph illustrating effects of the differential-resonator VCO shown in FIG. 1.
Figure 13:
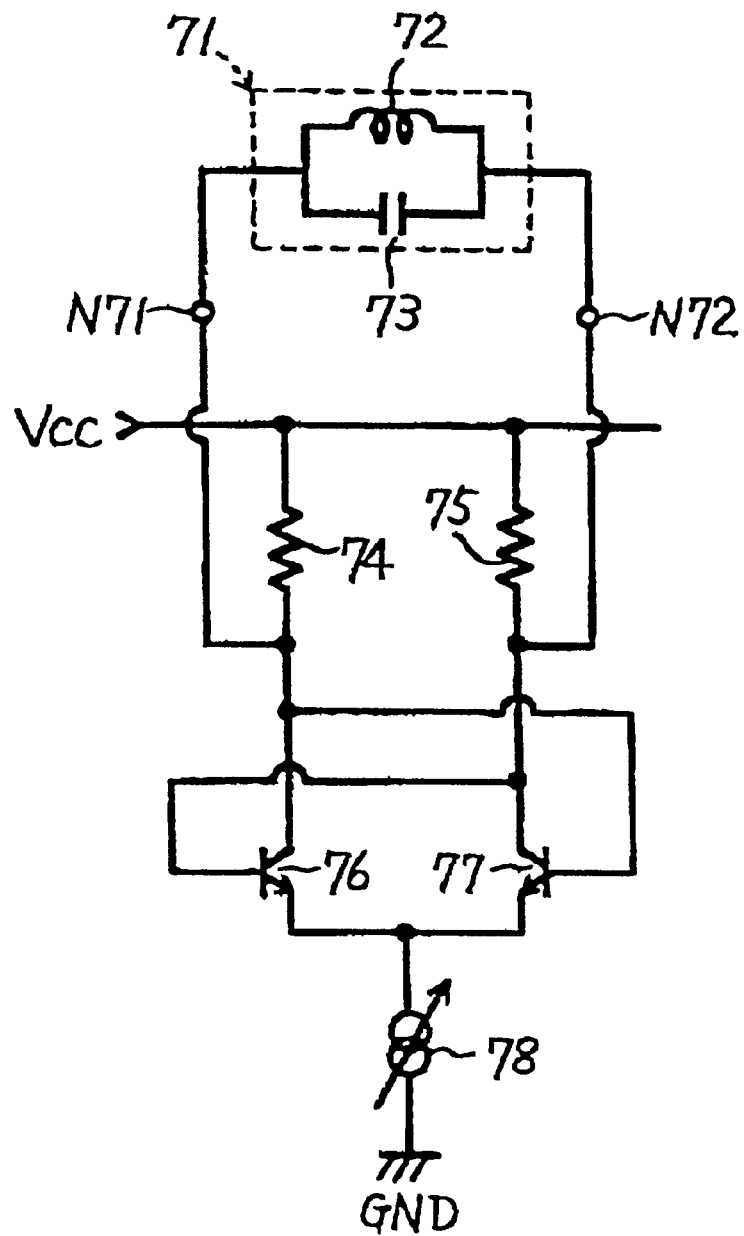
FIG. 13 is a circuit diagram showing the configuration of a conventional differential-LC VCO.

FIG. 5 is a diagram showing rates of change of oscillating frequencies versus temperature for the differential-resonator type VCO, the Colpitts type VCO, and the differential-LC type VCO. FIG. 6 is a diagram showing the rates of change of the oscillating frequency versus aging for each type of VCO. In each diagram, the change rate of frequency of the differential-resonator VCO is small, which is preferable, whereas the change rate of frequency of the differential-LC VCO is large. Because the inductor 72 (FIG. 13) has a low Q-factor, the differential-LC VCO inevitably has a low Q-factor, which leads to frequency instability. On the other hand, the differential-resonator VCO can oscillate highly accurately and stably without adjustment because the differential-resonator VCO employs the SAW resonator 1 instead of the inductor 72. Furthermore, since a variable component which needs mechanical adjustment to change inductance is not used for the VCO of the present invention, change in frequency with age is small.

The resistance elements 8 and 9 may optionally be omitted. Although both capacitors 4 and 5 are preferable in order to maintain equilibrium of the circuit, one of them may suffice when there are limitations concerning the layout of the circuit. Also, the circuit may be constructed in discrete components. However, in this case the NPN transistors 6 and 7 having uniform quality must be selected. Miniaturization of the VCO can be achieved by integrating the components other than the resonator 1. When the resonator 1 can be prepared by molding, the resonator 1 can be made in a single chip.

Figure 7:
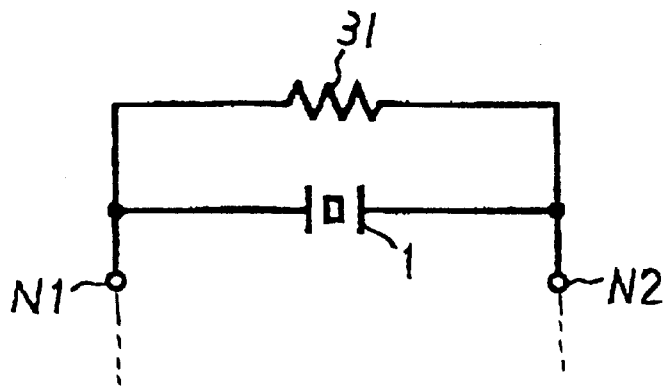
FIG. 7 is a diagram showing a further embodiment of the present invention.

Hereinbelow, various modifications of this embodiment are described. In a modification illustrated in FIG. 7, instead of the resonator 1 in FIG. 1, a parallel connection body having the resonator 1 and a resistance element 31 connected in parallel is provided in the VCO in FIG. 1. In this case, because the Q-factor of the resonance system including the resonator 1 and the resistance element 31 decreases, a range of variable frequencies of the VCO can be expanded.

Figure 8:
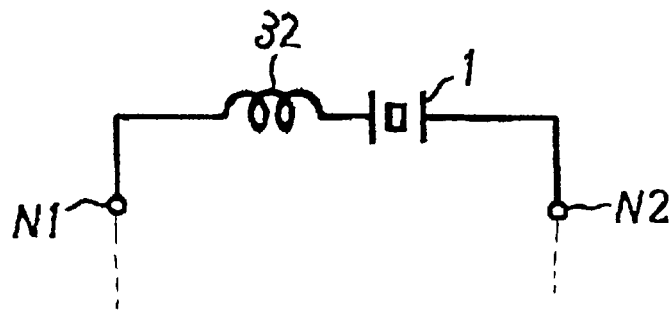
FIG. 8 is a diagram showing yet another embodiment of the present invention.

In a modification illustrated in FIG. 8, instead of the resonator 1 in FIG. 1, a series connection body having the resonator 1 and an inductor 32 connected in series is provided in the VCO in FIG. 1. In this case, the series resonant frequency shifts to a lower frequency. Also, because the Q-factor of the inductor 32 is smaller than that of the resonator 1 by one order of magnitude, the Q-factor of the resonance system decreases, which causes a range of variable frequencies of the VCO to be expanded.

Figure 9:
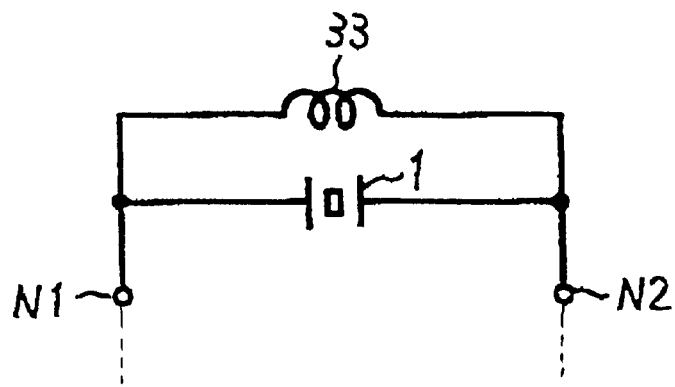
FIG. 9 is a diagram showing yet another embodiment of the present invention.

In a modification illustrated in FIG. 9, instead of the resonator 1 in FIG. 1, a parallel connection body having the resonator 1 and an inductor 33 connected in parallel is provided in the VCO in FIG. 1. In this case, the parallel resonant frequency shifts to a higher frequency. Also, because the Q-factor of the inductor 33 is smaller than that of the resonator 1 by one order of magnitude, the Q-factor of the resonance system decreases, which causes a range of variable frequencies of the VCO to be expanded.

Figure 10:
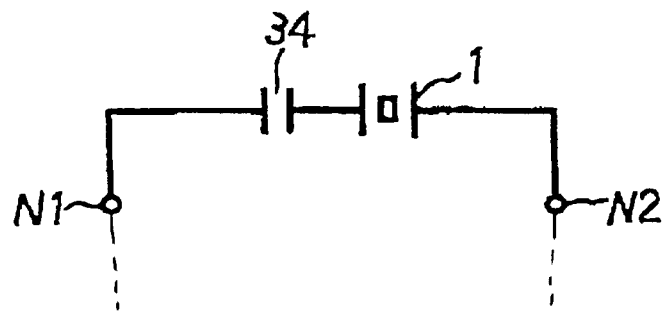
FIG. 10 is a diagram showing another embodiment of the present invention.

In a modification illustrated in FIG. 10, instead of the resonator 1 in FIG. 1, a series connection body having the resonator 1 and a capacitor 34 connected in series is provided in the VCO in FIG. 1. In this case, the series resonant frequency shifts to a higher frequency. Also, because the Q-factor of the capacitor 34 is smaller compared with that of the resonator 1, the Q-factor of the resonance system decreases, which causes a range of variable frequencies of the VCO to be narrowed, whereby the oscillation of the VCO becomes more stable.

Figure 11:
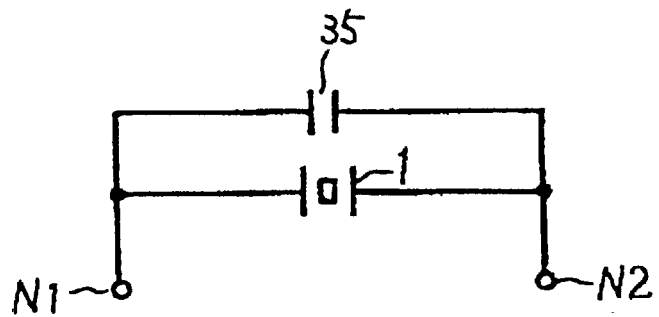
FIG. 11 is a diagram showing another embodiment of the present invention.
Figure 12:
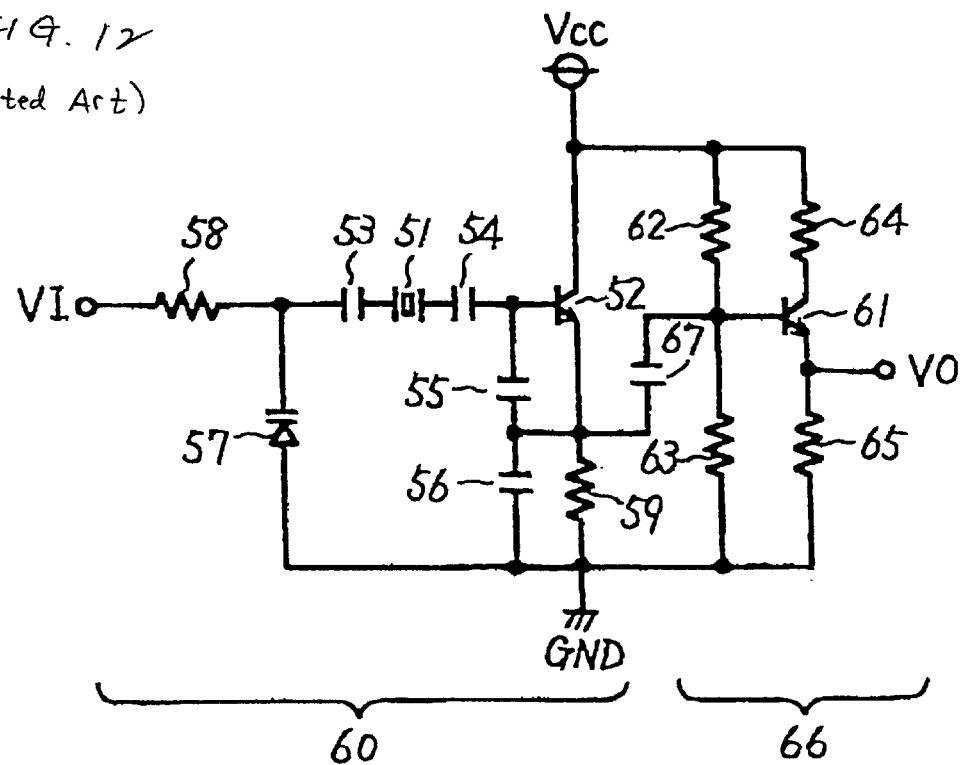
FIG. 12 is a circuit diagram showing the configuration of a conventional Colpitts VCO.

In a modification in FIG. 11, instead of the resonator 1 in FIG. 1, a parallel connection body having the resonator 1 and a capacitor 35 connected in parallel is provided in the VCO in FIG. 1. In this case, the parallel resonance frequency shifts to a lower frequency. Also, because the Q-factor of the capacitor 35 is smaller compared with that of the resonator 1, the Q-factor of the resonance system decreases, which causes a range of variable frequencies of the VCO to be narrowed, whereby the oscillation of the VCO becomes stable.

It should be understood that the present disclosure of preferred forms of the present invention are exemplary and not limited in every respect. The scope of the invention is defined by the appended claims rather than by the description preceding them, and all changes that fall within the scope of the claims, or equivalence of such scope of the claims, are intended to be included by the claims.

What is claimed is:

1. A voltage controlled oscillator oscillating at a frequency in accordance with a control voltage, the voltage controlled oscillator comprising:

a pair of differential transistors, in which a first electrode of one transistor is connected to a first electrode of the other transistor, and an input electrode of one transistor is connected to a second electrode of the other transistor with regard to each of the transistors;

a surface acoustic wave resonator connected between the second electrodes of said pair of differential transistors;

a first capacitor coupled between the input electrode of at least one transistor of said pair of differential transistors and the second electrode of the other transistor;

a voltage controlled current source connected to the first electrodes of said pair of differential transistors for flowing currents having a value in accordance with said control voltage;

first and second current limiting circuits, each provided between said voltage controlled current source and said first electrodes of said differential transistors; and a resistance element connected in parallel with said surface acoustic wave resonator.

2. A voltage controlled oscillator oscillating at a frequency in accordance with a control voltage, the voltage controlled oscillator comprising:

a pair of differential transistors, in which a first electrode of one transistor is connected to a first electrode of the other transistor, and an input electrode of one transistor is connected to a second electrode of the other transistor with regard to each of the transistors;

a surface acoustic wave resonator connected between the second electrodes of said pair of differential transistors;

a first capacitor coupled between the input electrode of at least one transistor of said pair of differential transistors and the second electrode of the other transistor;

a voltage controlled current source connected to the first electrodes of said pair of differential transistors for flowing currents having a value in accordance with said control voltage;

first and second current limiting circuits, each provided between said voltage controlled current source and said first electrodes of said differential transistors; and an inductor connected in series with said surface acoustic wave resonator between the second electrodes of said pair of differential transistors.

3. A voltage controlled oscillator oscillating at a frequency in accordance with a control voltage, the voltage controlled oscillator comprising:

a pair of differential transistors, in which a first electrode of one transistor is connected to a first electrode of the other transistor, and an input electrode of one transistor is connected to a second electrode of the other transistor with regard to each of the transistors;

a surface acoustic wave resonator connected between the second electrodes of said pair of differential transistors;

a first capacitor coupled between the input electrode of at least one transistor of said pair of differential transistors and the second electrode of the other transistor;

a voltage controlled current source connected to the first electrodes of said pair of differential transistors for flowing currents having a value in accordance with said control voltage;

first and second current limiting circuits, each provided between said voltage controlled current source and said first electrodes of said differential transistors; and an inductor connected in parallel with said surface acoustic wave resonator.

4. A voltage controlled oscillator oscillating at a frequency in accordance with a control voltage, the voltage controlled oscillator comprising:

a pair of differential transistors, in which a first electrode of one transistor is connected to a first electrode of the other transistor, and an input electrode of one transistor is connected to a second electrode of the other transistor with regard to each of the transistors;

a surface acoustic wave resonator connected between the second electrodes of said pair of differential transistors;

a first capacitor coupled between the input electrode of at least one transistor of said pair of differential transistors and the second electrode of the other transistor;

a voltage controlled current source connected to the first electrodes of said pair of differential transistors for flowing currents having a value in accordance with said control voltage;

first and second current limiting circuits, each provided between said voltage controlled current source and said first electrodes of said differential transistors; and a second capacitor connected in series with said surface acoustic wave resonator between the second electrodes of said pair of differential transistors.

5. A voltage controlled oscillator oscillating at a frequency in accordance with a control voltage, the voltage controlled oscillator comprising:

a pair of differential transistors, in which a first electrode of one transistor is connected to a first electrode of the other transistor, and an input electrode of one transistor is connected to a second electrode of the other transistor with regard to each of the transistors;

a surface acoustic wave resonator connected between the second electrodes of said pair of differential transistors;

a first capacitor coupled between the input electrode of at least one transistor of said pair of differential transistors and the second electrode of the other transistor;

a voltage controlled current source connected to the first electrodes of said pair of differential transistors for flowing currents having a value in accordance with said control voltage;

first and second current limiting circuits, each provided between said voltage controlled current source and said first electrodes of said differential transistors; and a second capacitor connected in parallel with said surface acoustic wave resonator.

6. A voltage controlled oscillator oscillating at a frequency in accordance with a control voltage, said voltage controlled oscillator comprising:

first and second transistors each having first, second and third electrodes;

a surface acoustic wave resonator connected between said first electrodes of said first and second transistors;

first current blocking filter connected between said second electrode of said first transistor and said first electrode of said second transistor;

second current blocking filter connected between said second electrode of said second transistor and said first electrode of said first transistor;

voltage controlled current source connected between said third electrodes of said first and second transistors and providing a current according to said control voltage;

first and second current limiting circuits, each provided between said voltage controlled current source and said third electrodes of said first and second transistors; and a resistance element connected in parallel with said surface acoustic wave resonator.

7. A voltage controlled oscillator oscillating at a frequency in accordance with a control voltage, said voltage controlled oscillator comprising:

first and second transistors each having first, second and third electrodes;

a surface acoustic wave resonator connected between said first electrodes of said first and second transistors;

first current blocking filter connected between said second electrode of said first transistor and said first electrode of said second transistor;

second current blocking filter connected between said second electrode of said second transistor and said first electrode of said first transistor;

voltage controlled current source connected between said third electrodes of said first and second transistors and providing a current according to said control voltage;

first and second current limiting circuits, each provided between said voltage controlled current source and said third electrodes of said first and second transistors; and an inductor connected in series with said surface acoustic wave resonator between said first electrodes of said first and second transistors.

8. A voltage controlled oscillator oscillating at a frequency in accordance with a control voltage, said voltage controlled oscillator comprising:

first and second transistors each having first, second and third electrodes;

a surface acoustic wave resonator connected between said first electrodes of said first and second transistors;

first current blocking filter connected between said second electrode of said first transistor and said first electrode of said second transistor;

second current blocking filter connected between said second electrode of said second transistor and said first electrode of said first transistor;

voltage controlled current source connected between said third electrodes of said first and second transistors and providing a current according to said control voltage;

first and second current limiting circuits, each provided between said voltage controlled current source and said third electrodes of said first and second transistors; and an inductor connected in parallel with said surface acoustic wave resonator.

9. A voltage controlled oscillator oscillating at a frequency in accordance with a control voltage, said voltage controlled oscillator comprising:

first and second transistors each having first, second and third electrodes;

a surface acoustic wave resonator connected between said first electrodes of said first and second transistors;

first current blocking filter connected between said second electrode of said first transistor and said first electrode of said second transistor;

second current blocking filter connected between said second electrode of said second transistor and said first electrode of said first transistor;

voltage controlled current source connected between said third electrodes of said first and second transistors and providing a current according to said control voltage;

first and second current limiting circuits, each provided between said voltage controlled current source and said third electrodes of said first and second transistors; and a capacitor connected in series with said surface acoustic wave resonator between the first electrodes of said first and second transistors.

10. A voltage controlled oscillator oscillating at a frequency in accordance with a control voltage, said voltage controlled oscillator comprising:

first and second transistors each having first, second and third electrodes;

a surface acoustic wave resonator connected between said first electrodes of said first and second transistors;

first current blocking filter connected between said second electrode of said first transistor and said first electrode of said second transistor;

second current blocking filter connected between said second electrode of said second transistor and said first electrode of said first transistor;

voltage controlled current source connected between said third electrodes of said first and second transistors and providing a current according to said control voltage;

first and second current limiting circuits, each provided between said voltage controlled current source and said third electrodes of said first and second transistors; and a capacitor connected in parallel with said surface acoustic wave resonator.

11. A voltage controlled oscillator according to claim 9, wherein a Q factor of said second capacitor is less than a Q factor of said surface acoustic wave resonator, wherein a range of variable frequencies of the voltage controlled oscillator is adjusted.

12. A voltage controlled oscillator according to claim 4, wherein a Q factor of said second capacitor is less than a Q factor of said surface acoustic wave resonator, wherein a range of variable frequencies of the voltage controlled oscillator is adjusted.

* * * * *